(12) United States Patent
Dannenberg et al.

(10) Patent No.: US 12,145,840 B2
(45) Date of Patent: Nov. 19, 2024

(54) MEMS SENSOR AS WELL AS METHOD FOR OPERATING A MEMS SENSOR

(71) Applicant: Robert Bosch GmbH, Stuttgart (DE)

(72) Inventors: Arne Dannenberg, Metzingen (DE); Mike Schwarz, Frankenberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 821 days.

(21) Appl. No.: 17/291,864

(22) PCT Filed: Jan. 20, 2020

(86) PCT No.: PCT/EP2020/051257
§ 371 (c)(1),
(2) Date: May 6, 2021

(87) PCT Pub. No.: WO2020/152090
PCT Pub. Date: Jul. 30, 2020

(65) Prior Publication Data
US 2022/0009769 A1 Jan. 13, 2022

(30) Foreign Application Priority Data
Jan. 25, 2019 (DE) .................... 10 2019 200 917.4

(51) Int. Cl.
*B81B 7/00* (2006.01)
*G01K 7/01* (2006.01)
*G01L 9/06* (2006.01)

(52) U.S. Cl.
CPC .............. *B81B 7/0096* (2013.01); *G01K 7/01* (2013.01); *G01L 9/065* (2013.01);
(Continued)

(58) Field of Classification Search
CPC .......... B81B 7/0096; B81B 2201/0264; B81B 2203/0127; B81B 2207/017; G01K 7/01; G01L 9/065; G01L 9/04
See application file for complete search history.

(56) References Cited

U.S. PATENT DOCUMENTS

| 11,035,709 B2 | 6/2021 | De Luca et al. |
| 2006/0289415 A1 | 12/2006 | Muehlheim et al. |

(Continued)

FOREIGN PATENT DOCUMENTS

| CN | 102448872 A | 5/2012 |
| CN | 104062340 A | 9/2014 |

(Continued)

OTHER PUBLICATIONS

Machine Translation of JP2007286008, Foreign Patent Documents No. 1 of Applicants' IDS filed May 6, 2021. Translation downloaded from: https://patents.google.com/patent/JP2007286008A/en?oq=2007-286008 on Mar. 22, 2024. (Year: 2007).*
International Search Report for PCT/EP2020/051257, Issued May 12, 2020,.

*Primary Examiner* — Robert G Bachner
(74) *Attorney, Agent, or Firm* — Norton Rose Fulbright US LLP; Gerard A. Messina

(57) ABSTRACT

A MEMS sensor. The MEMS sensor includes a deflectably situated functional layer, a conversion device for converting a deflection of the functional layer into an electrical signal, the conversion device including at least one electrical element, the at least one electrical element being at least partially electrically connected to a first area, and the first area being at least partially electrically connected to a second area, and the first and second areas and/or the first area and the at least one electrical element being electrically operable in a reverse direction and a forward direction, and a control unit, the control unit being designed to at least partially operate the at least one electrical element and the (Continued)

first area and/or the first area and the second area in the forward direction to provide thermal energy.

12 Claims, 3 Drawing Sheets

(52) U.S. Cl.
    CPC ............... *B81B 2201/0264* (2013.01); *B81B 2203/0127* (2013.01); *B81B 2207/017* (2013.01)

(56) References Cited

U.S. PATENT DOCUMENTS

| | | | |
|---|---|---|---|
| 2016/0123817 A1* | 5/2016 | Bennett | H01L 27/1225 374/185 |
| 2017/0260040 A1 | 9/2017 | Walter et al. | |

FOREIGN PATENT DOCUMENTS

| CN | 104995757 A | 10/2015 |
|---|---|---|
| JP | H0257933 A | 2/1990 |
| JP | 2007286008 A | 11/2007 |
| JP | 4797771 B2 | 10/2011 |
| JP | 6095929 B2 | 12/2012 |
| TW | 201725168 A | 7/2017 |
| WO | 2018134552 A1 | 7/2018 |

\* cited by examiner

MEMS SENSOR AS WELL AS METHOD FOR OPERATING A MEMS SENSOR

FIELD

The present invention relates to a MEMS sensor, including a deflectably situated functional layer.

The present invention furthermore relates to a method for operating a MEMS sensor.

Although the present invention may, in general, be applied to arbitrary MEMS sensors including a deflectably situated functional layer, the present invention is described based on MEMS pressure sensors.

BACKGROUND INFORMATION

Pressure sensors manufactured using micro system technology usually include a diaphragm made of silicon, responding with a deflection of the diaphragm to a change in the pressure on the diaphragm surface. This deflection or the mechanical stress caused thereby at the diaphragm edge may be converted into an electrical signal with the aid of piezoresistive resistors. To avoid negative influences on the sensor performance at low temperatures, for example due to expansion coefficients in the overall design, pressure sensors including an integrated heater became available, which are able to raise the temperature of the sensor to a certain minimum level. In these, Joule heating is generated in a metal strip conductor or also in a diffused-in semiconductor strip conductor, which is connected using additional bond pads, via electrical current.

SUMMARY

In one specific embodiment, the present invention provides a MEMS sensor, including a deflectably situated functional layer, a conversion device for converting a deflection of the functional layer into an electrical signal, the conversion device including at least one electrical element, the at least one electrical element being at least partially electrically connected to a first area, and the first area being at least partially electrically connected to a second area, and the first and second areas and/or the first area and the at least one electrical element being electrically operable in a reverse direction and a forward direction, and a control unit, the control unit being designed to at least partially operate the at least one electrical element and the first area and/or the first area and the second area in the forward direction to provide thermal energy.

The first and second areas may be part of the substrate in that the substrate is doped. In this way, first and second areas close to the surface may occur, but also deeper troughs. As an alternative, the application of accordingly doped surface areas on the substrate may also define these first and second areas. Through a suitable doping, at least one electric and/or electronic component may thereafter be introduced into one or both area(s)/trough(s). It is possible, for example, to introduce a p-doped piezo resistor into an n-doped trough. In this way, it is prevented that the current, generated as a result of bending, in the piezo resistor migrates into the substrate unimpeded.

In one further specific embodiment, the present invention provides a method for operating a MEMS sensor, the first and second areas being at least partially operated in the forward direction with the aid of the control unit for providing thermal energy.

One of the advantages achieved thereby is that, in this way, a separate heating device may be dispensed with, and thus the overall installation space may be reduced. Another advantage is that, in this way, the manufacturing costs may be reduced.

Further features, advantages and further specific embodiments of the present invention are described hereafter or become apparent thereby.

According to one advantageous refinement of the present invention, the reverse and forward directions of the first area and at least one electrical element on the one hand, and of the first area and the second area on the other hand, are opposite. The advantage of this is that, in this way, either a current flow from the first area to the second area, or from the first area to the at least one electrical element, occurs, which enables a simple operation for reading out signals on the one hand, and for heating on the other hand.

According to one further advantageous refinement of the present invention, the conversion device includes a Wheatstone bridge circuit including at least four electrical elements in the form of resistors. In this way, a conversion device for the provision of an electrical signal for the deflection of the functional layer may be provided in a simple manner.

According to one further advantageous refinement of the present invention, the electrical resistors are implanted or diffused-in piezoresistive resistors. One of the advantages achieved thereby is that, in this way, the resistors are able to interact directly with the diaphragm, and deflections of the diaphragm are directly detectable with the aid of the resistors.

According to one further advantageous refinement of the present invention, the control unit is designed to temporarily operate the first and second areas in the reverse direction, and temporarily in the forward direction. In this way, on the one hand, the electrical signal may be deliberately read out for a deflection of the functional layer and, on the other hand, a high current may be conducted through the MEMS sensor in the forward direction, so that the MEMS sensor heats up.

According to one further advantageous refinement of the present invention, the first area is designed in the form of a trough, in which the at least one electrical element is situated, in particular, the trough and the at least one electrical element including differing dopings. In this way, it may be avoided that current discharges out of the at least one electrical element instead of flowing through the conversion device. This improves the efficiency and the sensor performance. A "trough" shall, in particular, be understood to mean an essentially three-dimensional volume having rounded corners, the volume being delimited by a first material up to a lateral surface, and otherwise being completely filled with a second material.

According to one further advantageous refinement of the present invention, a voltage may be applied to the first and/or the second area(s) with the aid of a respective multitude of contactings, in particular, vias. One of the advantages achieved thereby is that, in this way, the current may be distributed across a large cross-sectional surface area of the junction between the two areas, which enables a high uniform current through-flow, and may ensure high heating, since the resistance may be kept low at the junction between the two areas.

According to one further advantageous refinement of the present invention, the deflectably situated functional layer is situated in the first area. In this way, the deflection of the functional layer may be directly converted into an electrical signal with the aid of the at least one electrical element. In this regard, the installation space is reduced.

According to one further advantageous refinement of the present invention, at least one additional surrounding element, in particular in the form of a trough, is situated, the at least one additional surrounding element being designed in such a way that it at least partially surrounds the first area and the second area. In this way, the provision of even more thermal energy is made possible.

According to one further advantageous refinement of the present invention, at least one additional contacting for at least one of the areas is situated, and the control unit is designed to provide thermal energy by operating the first and second areas in the forward direction and, simultaneously, operate the conversion device in such a way that an electrical signal is providable by the conversion device. In this way, the sensor performance is further enhanced.

According to one further advantageous refinement of the present invention, a temperature measuring element, in particular, a diode, is situated, and the control unit is designed to operate the temperature measuring element for providing thermal energy. In this way, an exact control or regulation of the discharge of the thermal energy is enabled.

Further important features and advantages of the present invention are derived from the figures, and from the associated description of the figures.

It shall be understood that the above-mentioned features and those still to be described hereafter may be used not only in the particular described combination, but also in other combinations, or alone, without departing from the scope of the present invention.

Preferred embodiments and specific embodiments of the present invention are shown in the figures and are described in greater detail in the following description, identical reference numerals referring to identical or similar or functionally equivalent components or elements.

DETAILED DESCRIPTION OF EXAMPLE EMBODIMENTS

Figure 1:
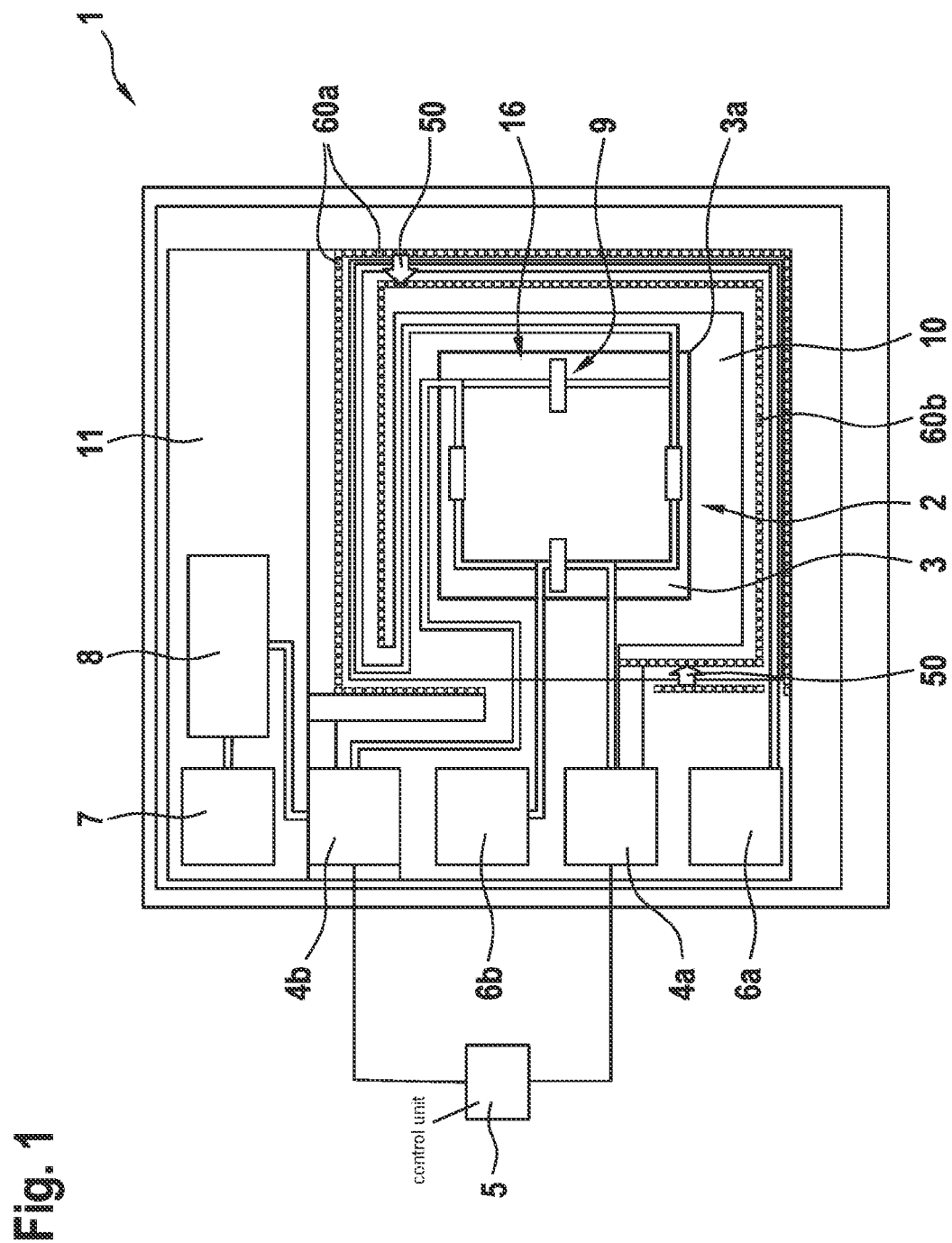
FIG. 1 shows a MEMS sensor according to one specific embodiment of the present invention.

FIG. 1 shows a MEMS sensor according to one specific embodiment of the present invention.

In detail, FIG. 1 shows a MEMS sensor 1 in a top view. MEMS sensor 1 includes a substrate (no reference numeral) in the process. A first area 10 and a second area 11 are situated on the substrate. In the process, the first and/or second area(s) may be provided directly in the substrate as a doped area close to the surface or as a deeper doped trough. In particular, it is provided that both areas are doped differently. As an alternative, it may also be provided that first and second surface areas for the definition of the first and second areas are applied to the substrate with the aid of conventional micromechanical methods, such as the use of masking and doping. Furthermore, a conversion device 2 is situated which, in turn, includes a Wheatstone bridge circuit 16 including piezoresistive resistors 9 in first area 10, and corresponding electrical contactings 4a, 4b, 6a, 6b, in second area 11. Furthermore, an electrical contacting 7 for a temperature sensor diode 8 is situated in second area 11. In addition, contactings 4a, 4b of Wheatstone bridge circuit 16 are connected to a control unit 5. Furthermore, two contactings 6a and 6b are situated in second area 11, which is essentially designed in an L-shaped manner on an essentially square surface area. In the process, contactings 4a, 4b, 6a, 6b are connected via corresponding metallization webs to piezoresistive resistors 9, first and second area 10, 11 and the like.

First area 10 is situated between the two legs of the L-shaped second area 11. As described above, Wheatstone bridge circuit 16 including four piezoresistive p-doped resistors 9 is situated in first area 10. These are connected, on the one hand, to contactings 6a, 6b for tapping an electrical signal, situated in second area 11, and, on the other hand, to the two contactings 4a, 4b, also situated in second area 11, between which a voltage may be applied with the aid of control unit 5. First area 10 is designed as a trough here and n-doped. Second area 11, in contrast, is p-doped. Furthermore, the piezoresistive p-doped resistors 9 are connected to a deflectable diaphragm 3 of MEMS sensor 1, for example integrated or implanted therein. The diaphragm edge is denoted by reference numeral 3a. If diaphragm 3 is deflected, for example by a change in pressure, the respective piezoresistive resistor 9 changes, and an accordingly modified electrical signal is provided via contactings 6a, 6b for measuring the pressure or its change.

To avoid that the current, when applied to contactings 4a, 4b, discharge out of piezoresistive resistors 9 into the substrate, instead of flowing through the entire Wheatstone bridge circuit 16, these piezo resistors 9 are applied in first area 10, which has the shape of a trough, or situated therein, in the case of p-doped piezoresistive resistors 9, for example, into an n-doped trough 10. In the case of p-doped piezo resistors 9, these must always be at a lower electrical potential than the n-doped trough 10 so that, on the one hand, the p-doped piezo resistors 9 are interconnected to the n-doped trough 10 and, on the other hand, the n-doped trough 10 is interconnected to the second, also p-doped area 11 in the reverse direction.

Control unit 5 now alternately operates n-doped trough 10 and p-doped piezo resistors 9, on the one hand, deliberately in the reverse direction to be able to read out the pressure signal with the aid of the deflection of diaphragm 3 and, on the other hand, deliberately in the forward direction to be able to conduct a high current through MEMS sensor 1, which heats MEMS sensor 1. In the process, the highest resistance in the sequence or chain: contacting 4a, 4b—"higher electrical potential"—to contacting 4b, 4a—"low electrical potential"—may be the diode operated in the forward direction and formed by the two areas 10, 11, i.e., p-area 11/n-trough 10, or also a resistor made up of a metal strip conductor or a semiconductor strip conductor. It is also possible, conversely, to use a p-doped trough 10 in the case of n-doped resistors 9.

To achieve a higher heating current, it is also possible to use p-doped troughs 11, instead of p-doped piezo resistors 9. In addition, a high number of closely situated vias 60a, 60b is shown, which make it possible to distribute the current across a large cross-sectional surface area of the p/n junction of the two areas 10, 11. To heat, for example, a MEMS pressure sensor package having the usual thermal coupling by 15° C., a heating resistor is required on MEMS sensor 1 of 100 ohm at a supply voltage of 1.6 V, so that a current flow of 16 mA and a power output of 32 mW result. A temperature diode usually used with conventional pressure sensors conducts approximately 1 mA of current at 0.8 V.

Assuming an identical behavior for p/n area diode 10, 11 shown in FIG. 1, only 16 times the cross-sectional surface area is required to be able to conduct the necessary current. This cross-sectional surface area is achievable with areas 10, 11 applied around diaphragm 3. In the process, half the heating power is discharged in diode, 0.8 V, and the other half in metal or semiconductor strip conductors, 0.8 V, so that, through suitable placement of the latter strip conductors, a lower temperature gradient may be achieved across the chip surface.

In FIG. 1, contactings 4a, 4b are advantageously connected for voltage supply, and not for the signal lines of Wheatstone bridge circuit 16, to a high number of vias 60a, 60b using corresponding metal strip conductors or metallizations, so that in the pressure sensor signal read-out mode, areas 10, 11 being operated in reverse direction, a possible leakage current through the barrier layer of areas 10, 11 does not have any influence on the sensor signal: In the case of external voltage regulation of Wheatstone bridge circuit 16, or its contactings 4a, 4b, the current through Wheatstone bridge circuit 16 also does not change significantly with a changed leakage current.

For reading out the electrical signal, first contacting 4a is grounded, and a voltage $V_{DD}$ is applied to second contacting 4b. In this way, second area 11 is at a lower potential than first area 10, and the diode thus formed between the two areas 10, 11 is operated in the reverse direction; the current flows through Wheatstone bridge circuit 16. To provide thermal energy, contacting 4b is now grounded, and a voltage $V_{DD}$ is applied to contacting 4a with the aid of control unit 5. In this way, second area 11 has a higher electrical potential than first area 10, and the diode formed between the two areas 10, 11 is thus operated in the forward direction. The current flows in direction 50 from second area 11 to first area 10, the resistance formed by the diode being the heating resistance.

In one further specific embodiment of the present invention, the distance between vias 60b in first area 10 may be increased in relation to vias 60a in second area 11. In one further alternative specific embodiment, vias 60a, 60b, in contrast to what is shown in FIG. 1, cannot be connected to contactings 4a, 4b, but are at least partially, in particular, completely, connected to signal lines, which are connected to contactings 6a, 6b.

Figure 2:
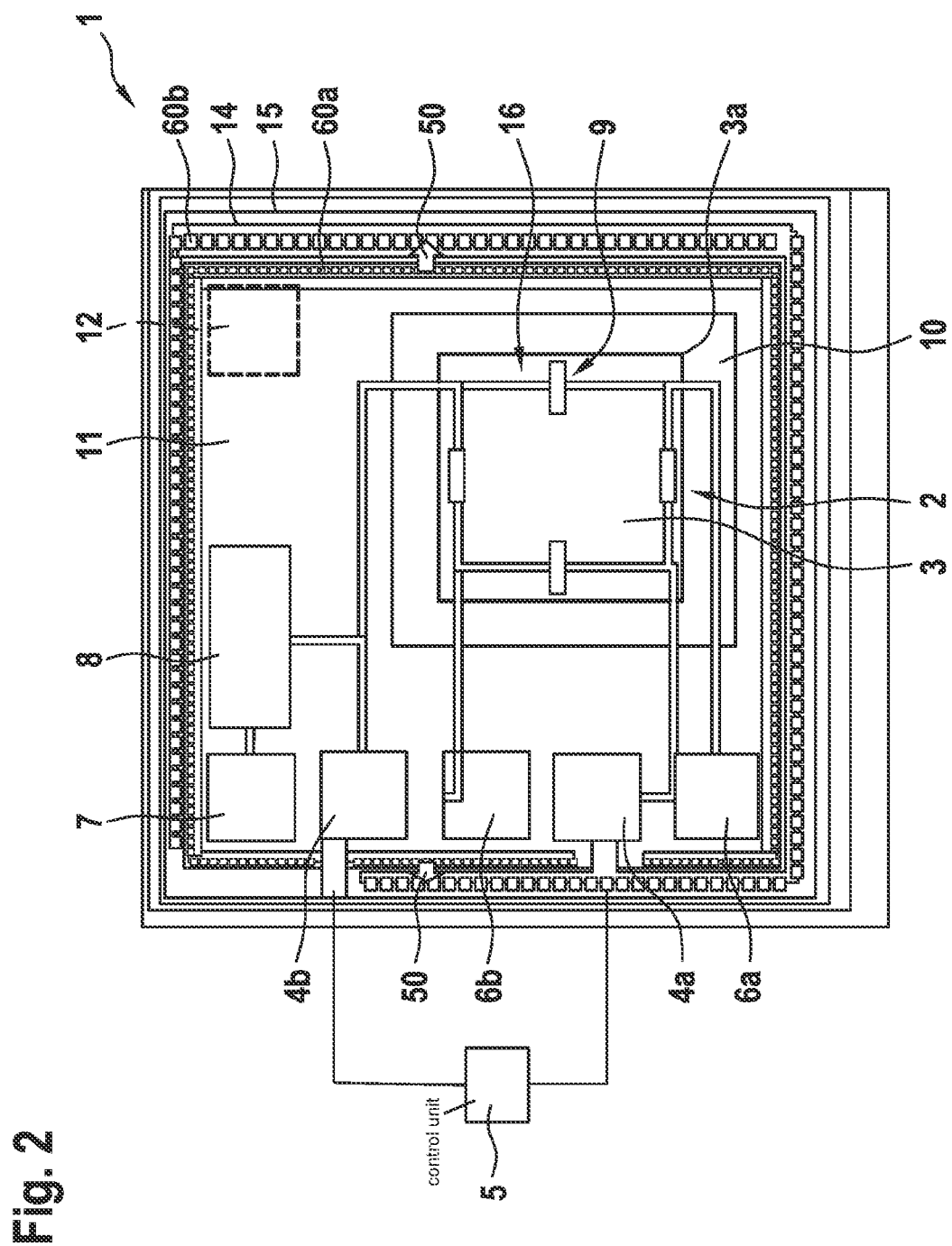
FIG. 2 shows a MEMS sensor according to one specific embodiment of the present invention.

FIG. 2 shows a MEMS sensor according to one specific embodiment of the present invention.

FIG. 2 essentially shows a MEMS sensor 1 according to FIG. 1. In contrast to MEMS sensor 1 according to FIG. 1, two additional differently doped troughs 14, 15 are situated in MEMS sensor 1 according to FIG. 2, so that essentially the following arrangement results, from inside to outside: In the interior, an n-doped trough 10 is situated, which includes Wheatstone bridge circuit 16 including piezoresistive resistors 9, which are p-doped. This n-doped trough 10 is surrounded by a second trough 11, which is p-doped and corresponds to second area 11, including contactings 4a, 4b, 6a, 6b for Wheatstone bridge circuit 16. In addition, a further n-doped trough 14 is now situated, which includes the two troughs 10, 11 and, in turn, is situated in a p-doped trough 15. In the process, the operation for the read-out of electrical signals of Wheatstone bridge circuit 16 and for the provision of thermal energy is, in turn, as follows, current flow 50 here in the heating mode occurring from trough 10 to the additional trough 14. Current flow 50 in the heating mode occurs essentially from the inside to the outside in the process. Furthermore, an additional contacting 12 is situated, which is at the same potential as contacting 4b and ensures a uniform application of voltage to vias 60a.

Figure 3:
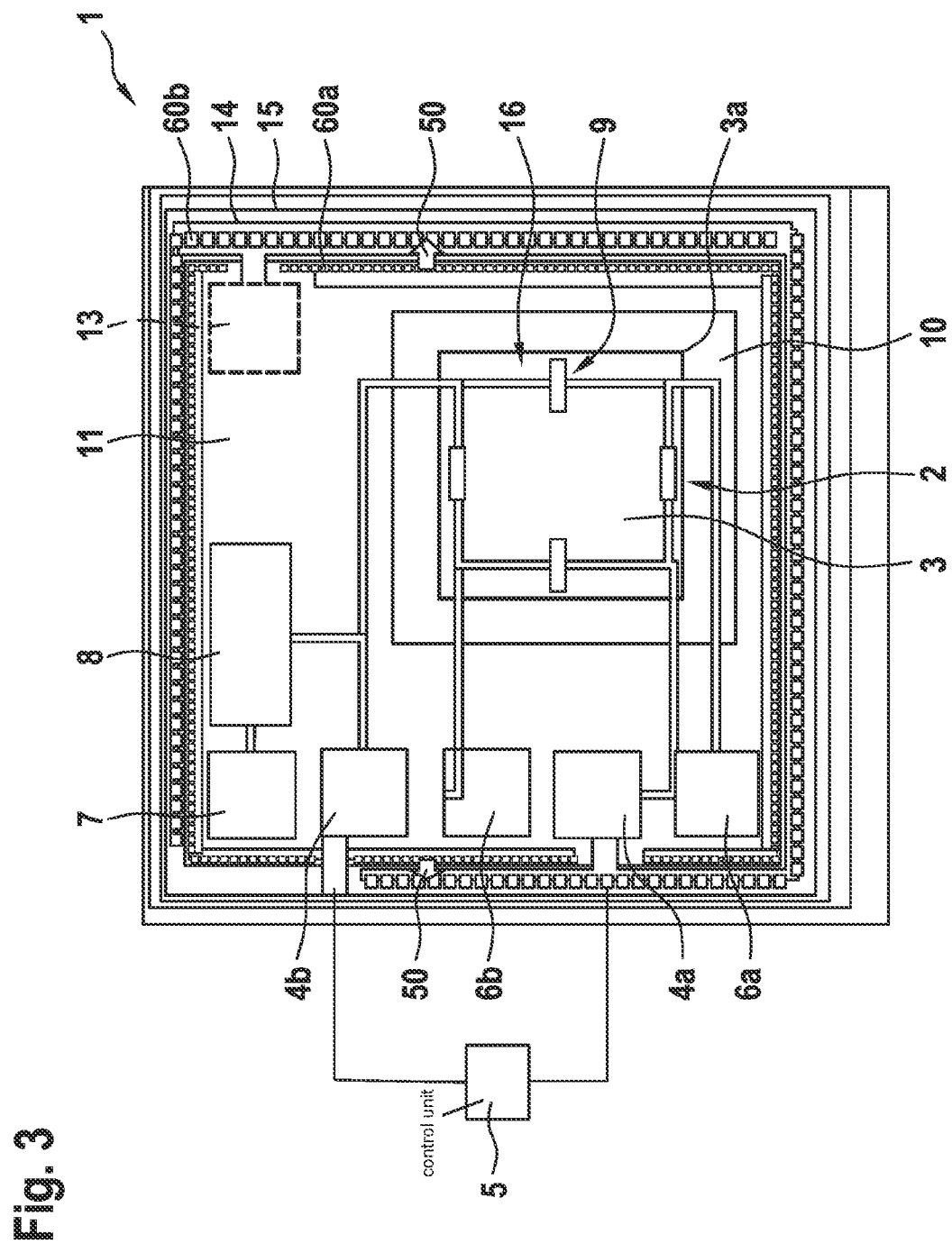
FIG. 3 shows a MEMS sensor according to one specific embodiment of the present invention.

FIG. 3 shows a MEMS sensor according to one specific embodiment of the present invention.

In detail, FIG. 3 shows a MEMS sensor 1 according to FIG. 2. In contrast to MEMS sensor 1 according to FIG. 2, an additional contacting 13 is situated in the case of MEMS sensor 1 according to FIG. 3, which makes it possible to heat and measure in parallel, regardless of the respective voltage application to contactings 4a, 4b. For this purpose, for example, a supply voltage $V_{DD}$ may be applied to contacting 4a, and contacting 4b may be grounded, and negative supply voltage—$V_{DD}$ may be applied to additional contacting 13.

In one further specific embodiment of the present invention, a separate temperature sensor diode 8 or also a temperature sensor MOSFET may be used instead of or in addition to diodes formed by areas 10, 11, 14, 15. It may be used as a temperature sensor at low currents, and it may be operated as an alternative or additional heating element at high currents.

In summary, at least one of the specific embodiments of the present invention has at least one of the following advantages:
small installation space
reduced costs
smaller chip surface area for the MEMS sensor
easy implementation.

Although the present invention has been described based on preferred exemplary embodiments, it is not limited thereto, but is modifiable in a variety of ways.

What is claimed is:

1. A MEMS sensor, comprising:
a deflectably situated functional layer;
a conversion device configured to convert a deflection of the functional layer into an electrical signal, the conversion device including at least one electrical element, the at least one electrical element being at least partially electrically connected to a first area, and the first area being at least partially electrically connected to a second area, the first and second areas and/or the first area and the at least one electrical element being electrically operable in a reverse direction and a forward direction; and
a control unit configured to at least partially operate the at least one electrical element and the first area and/or the first area and the second area, in the forward direction to provide thermal energy,
wherein a voltage may be applied to the first area and/or the second area with the aid of a respective multitude of contactings, the contactings including vias, the current flowing through the multitude of contactings being distributed across an enlarged cross-sectional surface of a p/n junction of the first and second areas.

2. The MEMS sensor as recited in claim 1, wherein the reverse and forward directions of the first area and at least one electrical element on the one hand, and of the first area and the second area on the other hand, are opposite to one another.

3. The MEMS sensor as recited in claim 1, wherein the conversion device includes a Wheatstone bridge circuit including at least four electrical elements in the form of resistors.

4. The MEMS sensor as recited in claim 3, wherein the electrical resistors are implanted or diffused-in piezoresistive resistors.

5. The MEMS sensor as recited in claim 1, wherein the control unit is configured to temporarily operate the first and second areas in the reverse direction, and temporarily in the forward direction.

6. The MEMS sensor as recited in claim 4, wherein the first area in the form of a trough, in which the at least one electrical element is situated, in particular, the trough and the at least one electrical element including differing dopings.

7. The MEMS sensor as recited in claim 1, wherein the deflectably situated functional layer is situated in the first area.

8. The MEMS sensor as recited in claim 6, wherein at least one additional surrounding element in the form of an additional trough, is situated, and the at least one additional surrounding element is configured in such a way that it at least partially surrounds the first area and the second area.

9. The MEMS sensor as recited in claim 1, wherein the MEMS sensor further includes at least one additional contacting, and the control unit is configured to provide thermal energy by operating the first and second areas in the forward direction and, simultaneously, operate the conversion device in such a way that an electrical signal is providable by the conversion device.

10. The MEMS sensor as recited in claim 1, wherein the MEMS sensor further includes a temperature measuring element, and the control unit is configured to operate the temperature measuring element for providing thermal energy.

11. The MEMS sensor as recited in claim 10, wherein the temperature measuring element is a diode.

12. A method for operating a MEMS sensor, the MEMS sensor including a deflectably situated functional layer, a conversion device configured to convert a deflection of the functional layer into an electrical signal, the conversion device including at least one electrical element, the at least one electrical element being at least partially electrically connected to a first area, and the first area being at least partially electrically connected to a second area, the first and second areas and/or the first area and the at least one electrical element being electrically operable in a reverse direction and a forward direction, and a control unit configured to at least partially operate the at least one electrical element and the first area and/or the first area and the second area, in the forward direction to provide thermal energy, the method comprising:
 at least partially operating the first and second areas the forward direction using the control unit to provide thermal energy,
 wherein a voltage may be applied to the first area and/or the second area with the aid of a respective multitude of contactings, the contactings including vias, the current flowing through the multitude of contactings being distributed across an enlarged cross-sectional surface of a p/n junction of the first and second areas.

* * * * *